(12) United States Patent
Shoda et al.

(10) Patent No.: US 6,429,898 B1
(45) Date of Patent: Aug. 6, 2002

(54) SOLID STATE IMAGING DEVICES AND DRIVING METHODS THAT PRODUCE IMAGE SIGNALS HAVING WIDE DYNAMIC RANGE AND MULTIPLE GREY SCALES

(75) Inventors: Masahiro Shoda, Gyoda; Shigeru Kato, Kawasaki, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/024,946

(22) Filed: Feb. 17, 1998

(30) Foreign Application Priority Data

Feb. 26, 1997 (JP) .............................. 9-042077

(51) Int. Cl.[7] .............................. H04N 5/335
(52) U.S. Cl. ...................... 348/316; 348/322
(58) Field of Search ................ 348/222, 229, 348/295, 296, 298, 311, 312, 314, 316, 317, 322, 323, 320; H04N 5/335

(56) References Cited

U.S. PATENT DOCUMENTS

| | | | |
|---|---|---|---|
| 4,302,779 A | | 11/1981 | Inoue |
| 4,783,702 A | | 11/1988 | Sone et al. |
| 5,438,365 A | * | 8/1995 | Yamashita et al. .......... 348/297 |
| 5,463,421 A | * | 10/1995 | Deguchi et al. ............. 348/296 |
| 5,488,416 A | * | 1/1996 | Kyuma ........................ 348/296 |
| 5,917,546 A | * | 6/1999 | Fukui ........................... 348/296 |

FOREIGN PATENT DOCUMENTS

| | | |
|---|---|---|
| EP | 0 505 117 | 9/1992 |
| EP | 0 561 633 | 9/1993 |
| GB | 2 184 915 A | 7/1987 |

* cited by examiner

*Primary Examiner*—Tuan Ho
(74) *Attorney, Agent, or Firm*—Klarquist Sparkman LLP

(57) ABSTRACT

The invention pertains to solid-state imaging devices and methods of operating the imaging devices for imaging objects having a wide dynamic range of illumination levels. The imaging device preferably comprises a two-dimensional array of photosensors, such as photodiodes, arranged in columns and even and odd rows. The photosensors accumulate signal charges corresponding to the incident light flux for an accumulation time. In one embodiment, the even and odd rows accumulate signal charges for different accumulation times. The signal charges from adjacent rows and the same column are preferably summed. In addition, the accumulation times for the even and odd rows preferably alternate between a first and a second accumulation time. Alternatively, alternate image fields acquire signal charge for alternating accumulation times. The longer accumulation time is set so that one or more of the photosensors saturates.

14 Claims, 13 Drawing Sheets

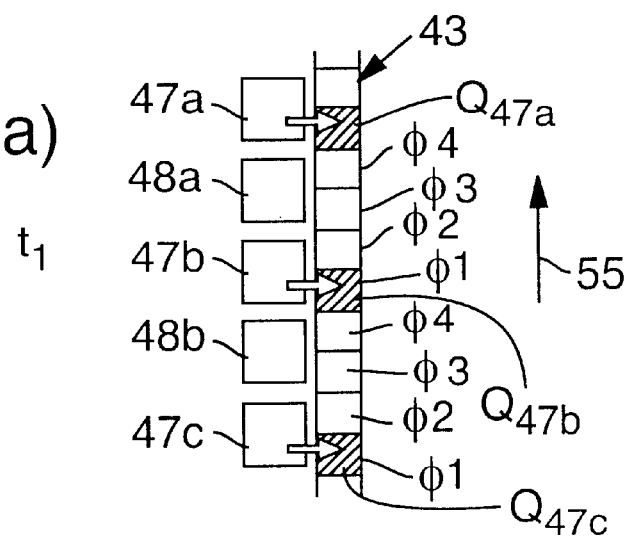
FIG. 7(a) $t_1$
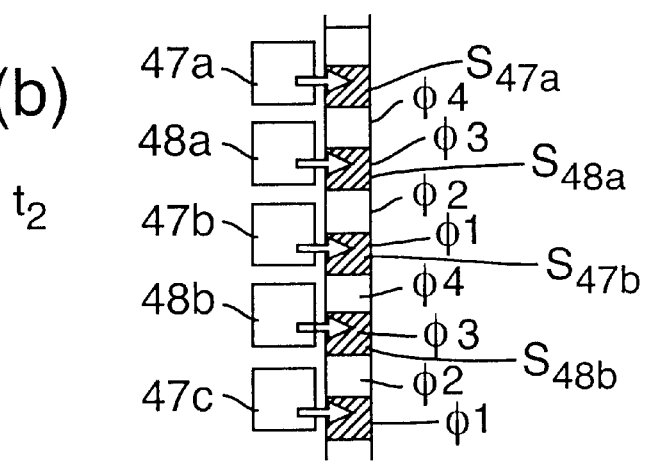
FIG. 7(b) $t_2$
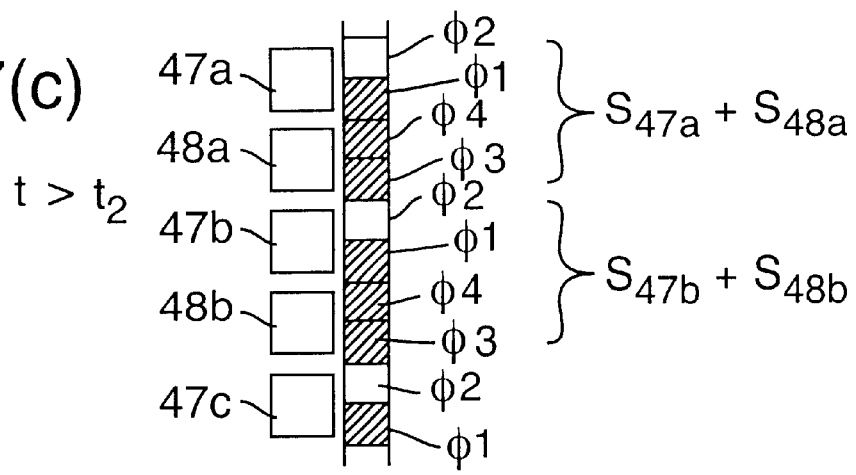
FIG. 7(c) $t > t_2$

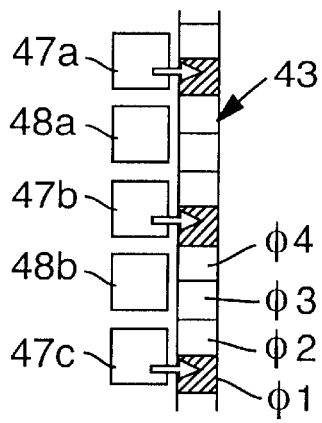
FIG. 10(a)  $t_1$
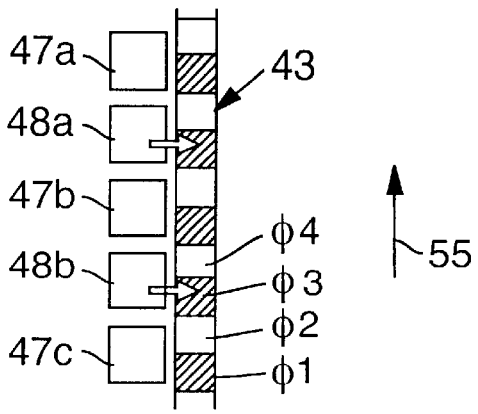
FIG. 10(b)  $t_2$
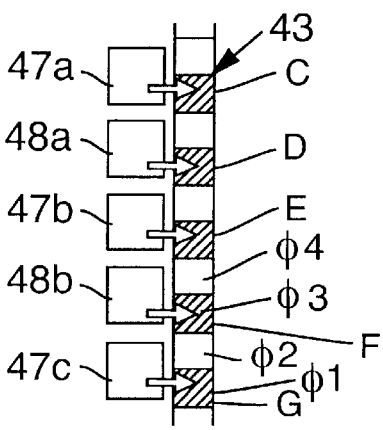
FIG. 10(c)  $t_3$
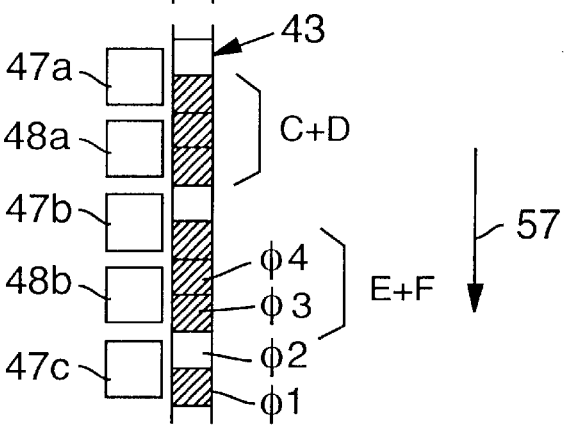
FIG. 10(d)

16a : 1/60 sec
16b : 1/500 sec
16c : 1/1000 sec
16d : 1/1500 sec

SOLID STATE IMAGING DEVICES AND DRIVING METHODS THAT PRODUCE IMAGE SIGNALS HAVING WIDE DYNAMIC RANGE AND MULTIPLE GREY SCALES

FIELD OF THE INVENTION

The invention pertains to a solid-state imaging device and a method for operating the imaging device that provides wide dynamic range and multiple gray-scale image signals.

BACKGROUND OF THE INVENTION

Solid-state imaging devices using charge-coupled devices ("CCDs") have been used as image sensors in electronic and video cameras. Solid-state imaging devices have been further developed to be sensitive to infrared radiation for applications such as thermal imaging or night vision.

With reference to FIG. 15, a prior-art solid-state imaging device for infrared imaging uses a two-dimensional array of PtSi Schottky diodes 61. "Vertical" CCD arrays 62 are provided adjacent the columns of the PtSi diodes 61 and columnar transfer gates 63 are placed between respective vertical CCD arrays and columns of PtSi diodes 61.

Electrodes $\phi 1$–$\phi 4$ are connected to the vertical CCD arrays 62. In FIG. 15, the electrodes $\phi 1$–$\phi 4$ are shown connected to one of the vertical CCD arrays 62 corresponding to the first column of PtSi diodes 61. For simplicity, the connections of the electrodes $\phi 1$–$\phi 4$ to the other vertical CCD arrays 62 are not shown. One end of each of the vertical CCD arrays 62 is connected to a "horizontal" CCD array 64. An output amplifier 66 is connected to an output buffer 64a of the horizontal CCD array 64. The other ends of the vetical CCD arrays 62 are connected to a discharge line 67.

The imaging device of FIG. 15 provides interlaced output by providing odd and even fields. An operation in which an odd field is read out is described below. First, voltages are applied to the electrodes $\phi 1$–$\phi 3$, forming potential wells at the vertical CCD arrays 62 that receive signal charges accumulated by the PtSi diodes 61. The accumulated charges are transferred to the potential wells with the transfer gates 63. Signal charges on an $n_{th}$ row (where n is an odd integer) of PtSi diodes 61 and signal charges on an $(n+1)_{th}$ row are mixed in one potential well. Thus, signal charges for a single horizontal line are produced. Next, four different driving pulses are applied successively to the electrodes $\phi 1$–$\phi 4$, transferring the signal charges in the potential wells vertically to the horizontal CCD array 64.

The horizontal CCD array 64 successively receives signal charges from rows of the diodes 61; the signal charges are delivered to the horizontal CCD array 64 from the vertical CCD arrays 62. These signal charges are transferred to the amplifier 66 during a horizontal scanning interval.

An even field is read by forming potential wells under the electrodes $\phi 4$, $\phi 1$, $\phi 2$. Signal charges on an $n_{th}$ row (where n is an odd integer) of PtSi diodes 61 and signal charges on an $(n-1)_{th}$ row are mixed, whereby signal charges corresponding to a horizontal line are produced.

The readout operations are carried out so that signal charges for an even field or an odd field are read out sequentially during one field period, e.g. 1/60 s for NTSC standard video. Readout of an odd field and an even field (one complete frame or image) requires 1/30 s.

Imaging devices with electronic shutter capability (i.e. that have variable signal charge accumulation times) have been disclosed in Japanese Examined Patent Publication No. 1-18629. Electronic shutter operation can also be described with reference to FIG. 15. First, unwanted charges accumulated on the PtSi diodes 61 are transferred to the vertical CCD arrays 62 via the transfer gates 63. The vertical CCD arrays 62 are driven so that the unwanted charges are swept to the discharge line 67.

After a specified accumulation time has elapsed after the discharge at the discharge line 67, accumulated signal charges are transferred to the vertical CCD arrays 62 via the transfer gates 63. The vertical CCD arrays 62 are driven so that the signal charges from the rows of PtSi diodes 61 are sequentially transferred to the horizontal CCD array 64. The horizontal CCD array 64 then transfers the signal charges to the amplifier 66. By varying the accumulation time, an electronic shutter operation is achieved.

With reference to FIG. 16, the output of the imaging device of FIG. 15 with electronic shutter operation is shown as a function of blackbody temperature of an object being imaged. The blackbody temperatures were measured using a blackbody oven; such blackbody temperatures are analogous to luminance levels of visible light. The vertical axis indicates the number (in base-10 exponential notation) of output electrons generated by the PtSi Schottky diodes 61 for objects as a function of blackbody temperature.

With reference to FIG. 16, output-characteristic curves 16a–16d show outputs of the horizontal CCD array 64 for signal-charge accumulation times of 1/60, 1/500, 1/1000, and 1/1500 s, respectively. For an accumulation time of 1/60 s as shown by curve 16a, there is a large variation in charge output for objects with a range of blackbody temperatures from 20 C. to 80 C., and the images produced have a wide dynamic range. Objects associated with this range of blackbody temperatures are therefore imaged with multiple gray-scale levels. However, at blackbody temperature greater than about 100 C., signal charges fill and overflow the PtSi diodes 61, and the output saturates. Thus, images of objects at blackbody temperatures greater than 100 C. have on a few gray-scale levels.

With reference to curve 16d, corresponding to an accumulation time of 1/1500 s, the output charge changes rapidly with temperature for blackbody temperatures near 200 C. Objects at blackbody temperatures near 200 C. are therefore imaged with multiple gray-scale levels, and excellent images are formed of such objects. However, at blackbody temperature near 20 C., the output is low, and the output signal-to-noise ratio is low. Images of objects at these temperatures are noisy and have few gray-scale levels.

The curves 16b, 16c, corresponding to signal charge accumulation times of 1/500 s and 1/1000 s, respectively, have narrow ranges of blackbody temperatures at which images with multiple gray-scale levels are produced. As will be readily apparent from curves 16a–16d, high-quality (i.e., wide dynamic range, multiple gray-scale) images are difficult to obtain of objects having large temperature variations.

The above description concerns exposure control with an electronic shutter, but a similar problem occurs with exposure control using lens apertures or filters. These exposure-control techniques also do not improve the dynamic range or the gray-scale output of the imaging device. While the description above concerns infrared imaging with infrared-sensitive imaging devices, it is similarly difficult for an imaging device sensitive to visible light to produce images with a wide dynamic range and multiple gray-scale levels.

It is apparent that imaging devices and methods are needed that produce images with a wide dynamic range and multiple gray-scale levels.

SUMMARY OF THE INVENTION

The invention provides solid-state imaging devices comprising a plurality of photosensors arranged in a matrix of rows and columns. The rows comprise odd-numbered rows and even-numbered rows. The photosensors accumulate signal charges corresponding to an incident light flux. "Vertical" transfer paths corresponding to each column of photosensors are provided to transfer signal charges (or unwanted charges) to a "horizontal" transfer path. The horizontal transfer path transfers the charges to an output amplifier that produces an electrical image signal corresponding to the distribution of the light flux intensity on the photosensors. Each of the vertical and horizontal transfer paths are preferably arrays of charged-coupled devices (CCDs).

Gates are provided to control the transfer of charges from the photosensors to the vertical transfer paths. The gates are controlled so that the accumulation times during which signal charges produced by the photosensors accumulate are adjustable. The gates preferably control accumulation times so that the odd rows and even rows have different accumulation times. The longer accumulation time is preferably set so that the photosensors that are irradiated by the most intense portion of the incident light flux are saturated. Such an imaging device produces image signals having a wide dynamic range and multiple gray-scale levels.

The photosensors are preferably PtSi Schottky diodes or semiconductor junctions, but it will be apparent that other photosensors are suitable. Depending on the photosensors, the imaging device is suitable for use in various wavelength ranges, including the visible and infrared ranges.

Shallow well junctions or lower potential barriers are preferably provided so that excess signal charge is discharged to the substrate of the imaging device. In this way, the excess charge does not reach other photosensors or the vertical transfer paths, and image blooming is suppressed. The potential-barrier height of the shallow well junctions or lower potential barriers is preferably shallower than the potential barriers of the p-n junction of the photosensor.

The imaging device can further comprise a summing junction that sums the signal charges of an odd row and an adjacent even row so that the charges from photosensors in the same column are summed. The summing can be done on the vertical transfer paths or on an external adder in conjunction with an external delay The invention also provides methods of operating solid-state imaging devices so that wide dynamic range, multiple gray-scale images are formed. The methods comprise the step of accumulating signal charge on adjacent rows of photosensors for different accumulation times and then summing the signal charges from the corresponding columns of the adjacent rows. The charges can be summed in potential wells in the imaging device or summed externally. The summed charges are then delivered to an output amplifier. The different accumulation times are preferably associated with odd and even rows alternately. For example, in forming an interlaced scan image, the odd rows and the even rows have first and second accumulation times during an odd field; during an even field, the odd rows have the second accumulation time and the even rows have the first accumulation time. The longer of the first and second accumulation times is adjusted so that one or more photosensors saturate.

Because even and odd rows have different accumulation times, the imaging device provides an image with multiple gray-scale levels irrespective of whether the object imaged is bright or dark. Moreover, by selecting only the odd rows or the even rows, an image representing either a bright or dark area is produced with multiple gray-scale levels.

The accumulation times for odd and even rows need not be switched, but the following disadvantage is avoided by switching these times. For an odd field, charges on an nth row (where n is an odd integer) of photosensors and those on an $(n+1)_{th}$ row are summed. In conventional two-line interlaced scanning, the signal charges on the nth and $(n+1)_{th}$ row are approximately equal. The apparent center of a horizontal line made by the summation is therefore nearly equidistant from the nth row and the $(n+1)_{th}$ row. However, in the imaging devices of the present invention, the accumulation times. differ for even and odd rows of photosensors. The apparent center of a horizontal line corresponding to the summed charges is nearer the row having the longer accumulation time.

In an even field, charges on an $(n-1)_{th}$ and an nth row of photosensors are summed. In this case as well, the apparent center of such a horizontal line is nearer the row having the longer accumulation time. The displacement of the apparent centers degrades image resolution. In a display device such as a shadow-mask cathode-ray tube, horizontal lines corresponding to even and odd fields are uniformly spaced irrespective of the shift of the apparent center. By alternately switching accumulation times between odd and even fields, the apparent centers are not displaced.

In addition, accumulation times can be alternated between even and odd fields, whereby the odd field accumulates charge for a first accumulation time, and the even field accumulates charge for a second accumulation time. The accumulation times are then switched so that the next odd field accumulates charge for the second accumulation time, and the next even field accumulates charge for the first accumulation time.

The foregoing and other objects, features, and advantages of the invention will become more apparent from the following detailed description of Example Embodiments which proceeds with reference to the accompanying drawings.

BRIEF DESCRIPTION OF THE DRAWINGS

FIGS. 7(a)–7(c) sequentially illustrate image signal readout for an even field in Example Embodiment 1.

FIGS. 10(a)–10(d) sequentially illustrate image-signal readout for an even field according to Example Embodiment 2.

DETAILED DESCRIPTION

Figure 1:
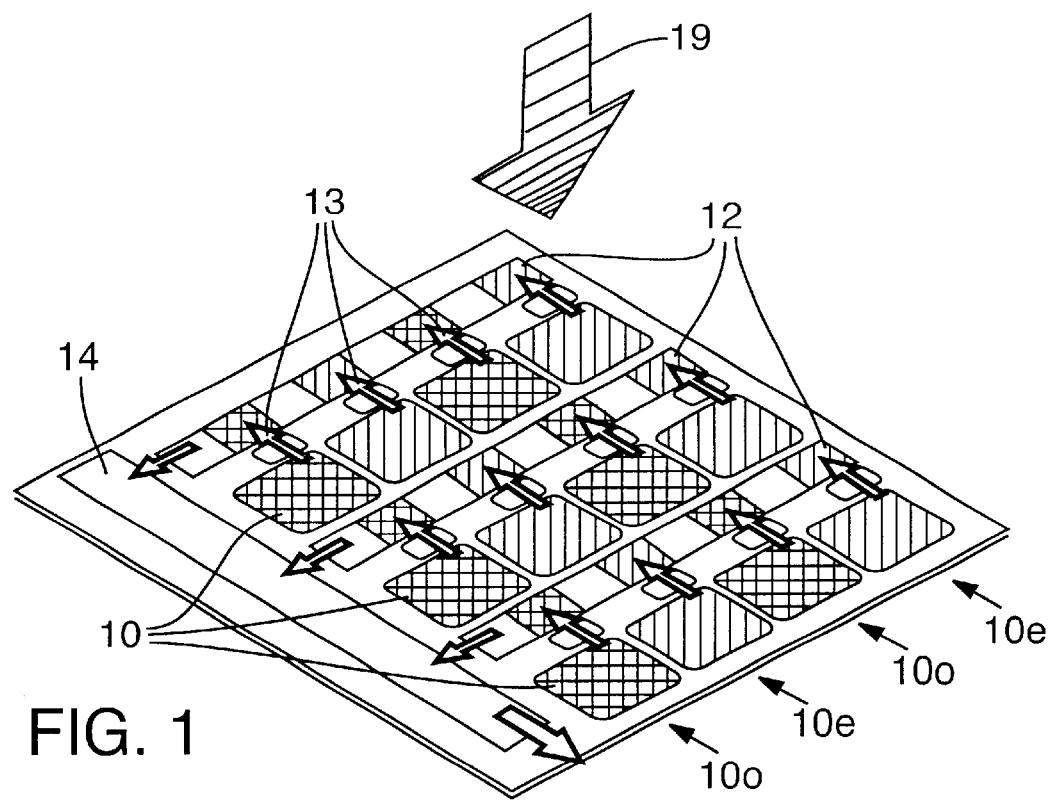
FIG. 1 is a perspective view showing certain general characteristics of a preferred embodiment of a solid-state imaging device according to the invention.

With reference to FIG. 1, a solid-state imaging device comprises a two-dimensional array of photosensors 10. The array of sensors 10 has even-numbered and odd-numbered rows 10e, 10o, respectively. The sensors 10 accumulate signal charges corresponding to the intensity of an incident light flux 19 on the respective sensors 10. It will be apparent that the sensors 10 correspond to picture elements ("pixels") of an image produced by the imaging device of FIG. 1. Respective "vertical" transfer paths 12 are provided for the columns of sensors 10; charges from the sensors 10 are transferred column-wise along the vertical transfer paths 12. Each of the vertical transfer paths 12 preferably comprises a "vertical" array of CCDs.

The imaging device of FIG. 1 preferably further comprises gates 13 that deliver charges from the respective sensors 10 to the respective vertical transfer paths 12. The transfer can be controlled so that charge is accumulated by the sensors 10 for a selectable time. A "horizontal" transfer path 14 is provided for transferring, in a row-by-row manner, charges received from the vertical transfer paths 12.

The imaging device is controlled so that signal-charge accumulation times of the even-numbered rows 10e and the odd-numbered rows 10o have differing accumulation times. A maximum accumulation time for either the odd rows 10o or the even rows 10e is set so that the sensors 10 of one of the types of rows saturate.

Figure 2:
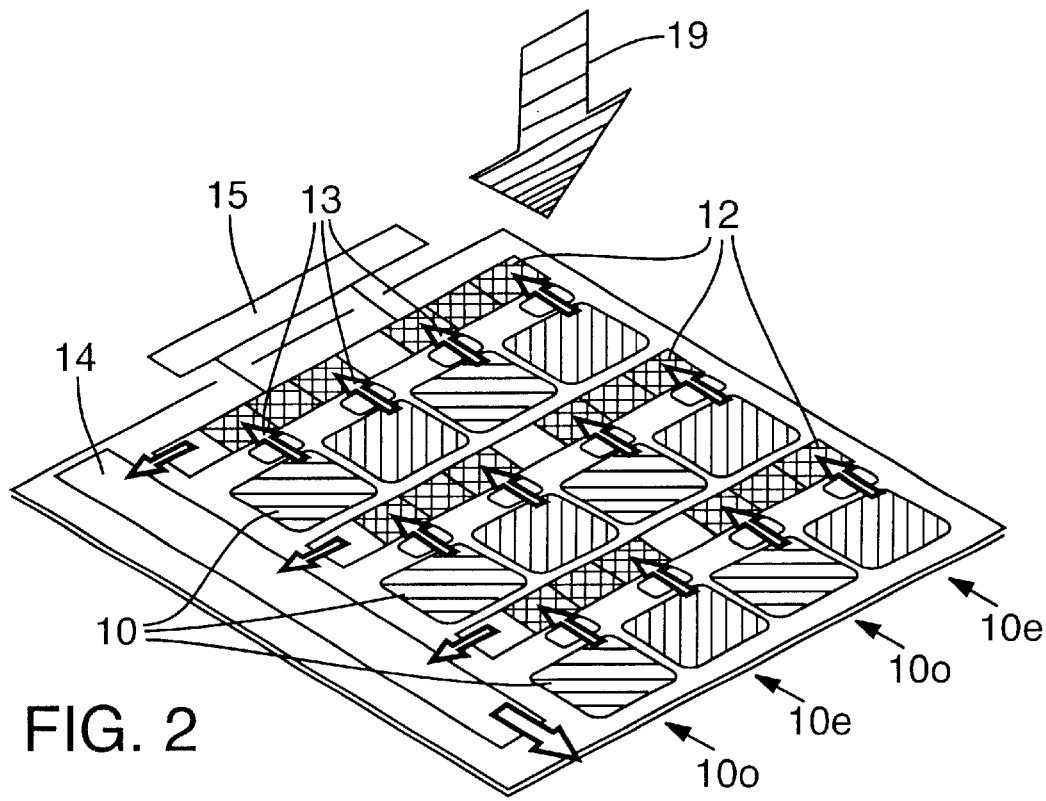
FIG. 2 is a perspective view of a the solid-state imaging device of FIG. 1 with a summing junction.

With reference to FIG. 2, an imaging device similar to the imaging device of FIG. 1 is provided but further comprising a summing junction 15 that sums signal charges from the sensors 10 from the same column and adjacent rows. In this imaging device, an image is produced whose rows of pixels correspond to the summed charges of the alternate rows of sensors 10.

EXAMPLE EMBODIMENT 1

Figure 4:
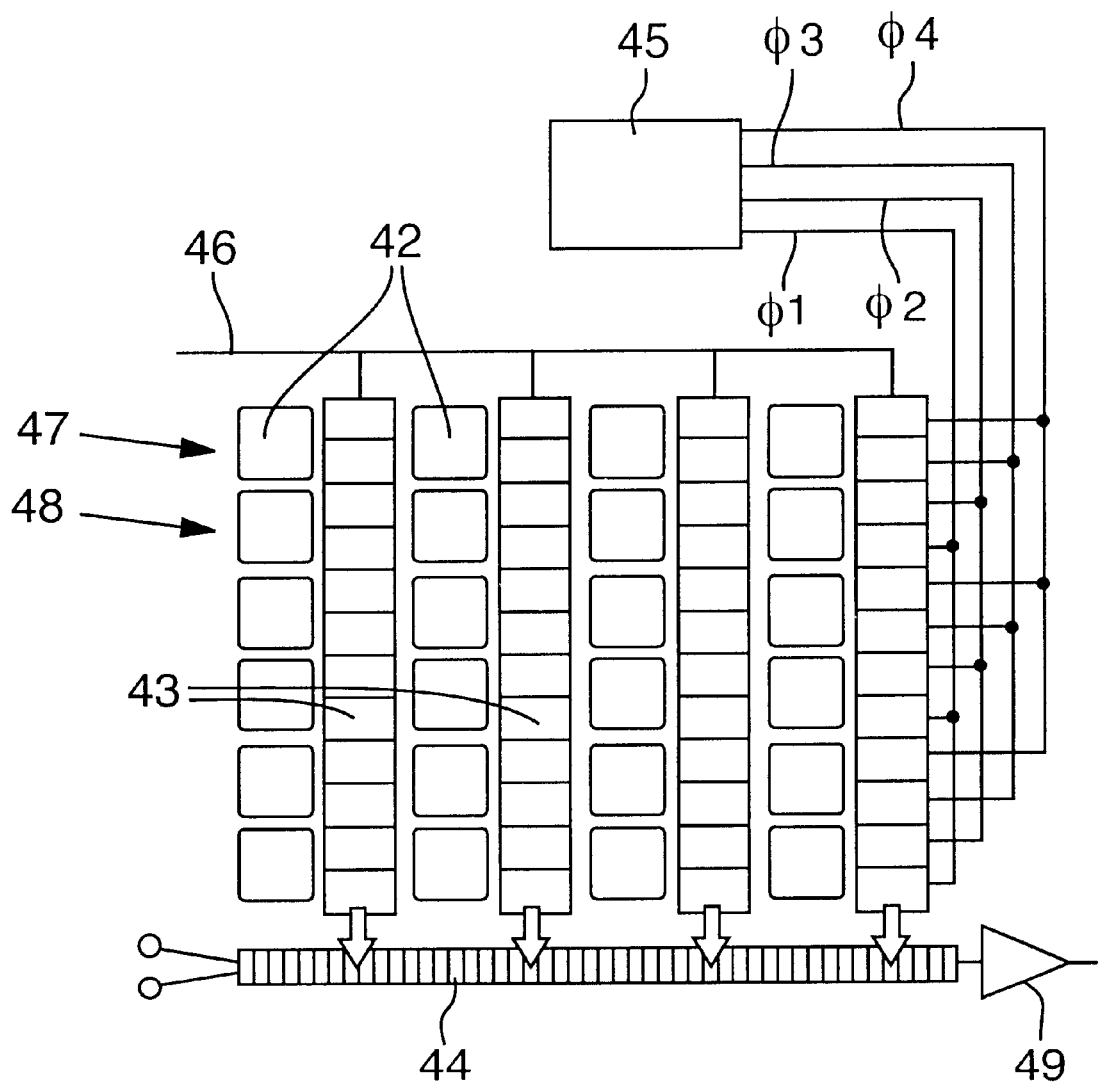
FIG. 4 is schematic diagram of a solid-state imaging device according to Example Embodiment 1.

With reference to FIG. 4, a solid-state imaging device for detecting infrared images comprises a two-dimensional array of PtSi Schottky diodes 42. The array comprises odd-numbered rows 47 and even-numbered rows 48 of diodes 42. "Vertical" arrays of CCDs 43 are provided adjacent the columns of the array of PtSi diodes 42; each column has a corresponding vertical CCD array 43. Electrodes φ1–φ4 are connected to the vertical CCD arrays 43 and are driven by a vertical drive circuit 45. For simplicity, FIG. 4 shows the electrodes φ1–φ4 connected to only one of the vertical CCD arrays 43; corresponding connections to the remaining vertical CCD arrays 43 are not shown.

A horizontal CCD array 44 is situated along one end of the vertical CCD arrays 43 to receive charges from the vertical CCD arrays 43. The horizontal CCD array 44 delivers the charges to an output amplifier 49 whose output is an electrical signal corresponding to 35 the charges received from the diodes 42. The other ends of the vertical CCD arrays 43 are attached to a discharge line 46.

Figure 5A:
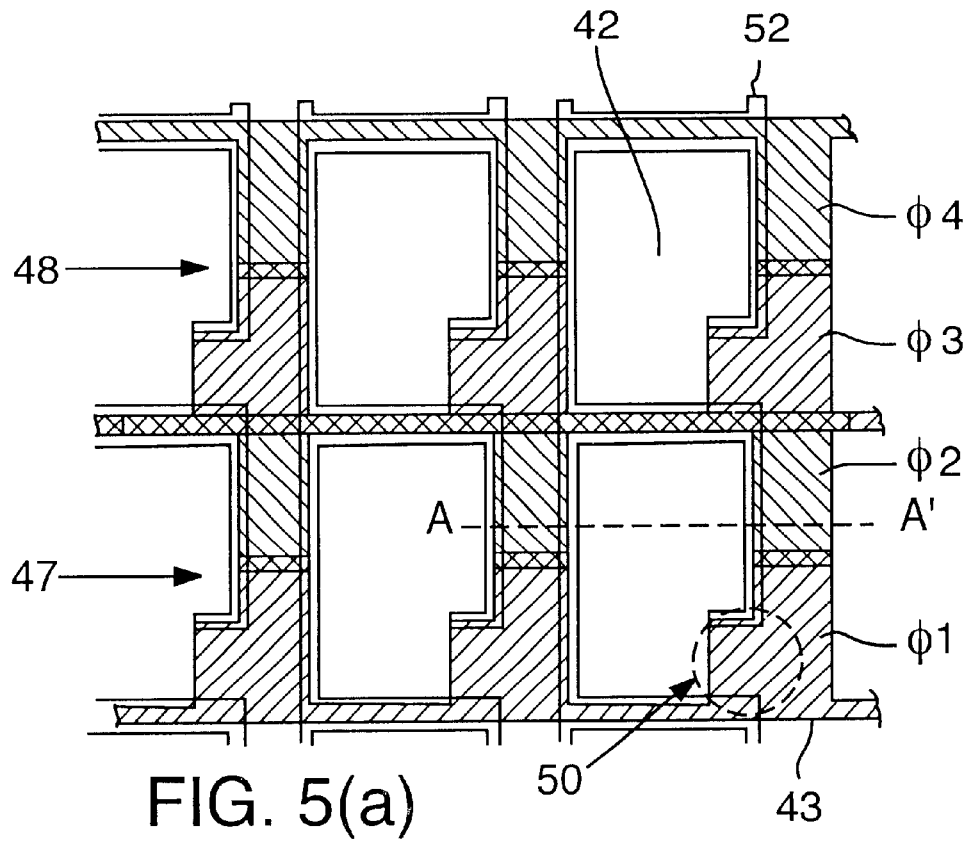
FIG. 5(a) is a schematic diagram of a photosensor of the imaging device of FIG. 4.

With reference to FIG. 5(a), the two electrodes φ1, φ2 are associated with the odd rows 47 of the diodes 42; the two electrodes φ3, φ4 are associated with the even rows 48. An isolation region 52 surrounds each of the diodes 42. P+ diffusion layers are formed at gaps 50 in the isolation region 52. The electrodes (φ1, φ3 cover the gaps 50 in the p+ diffusion layers and serve as gates.

Figure 5B:
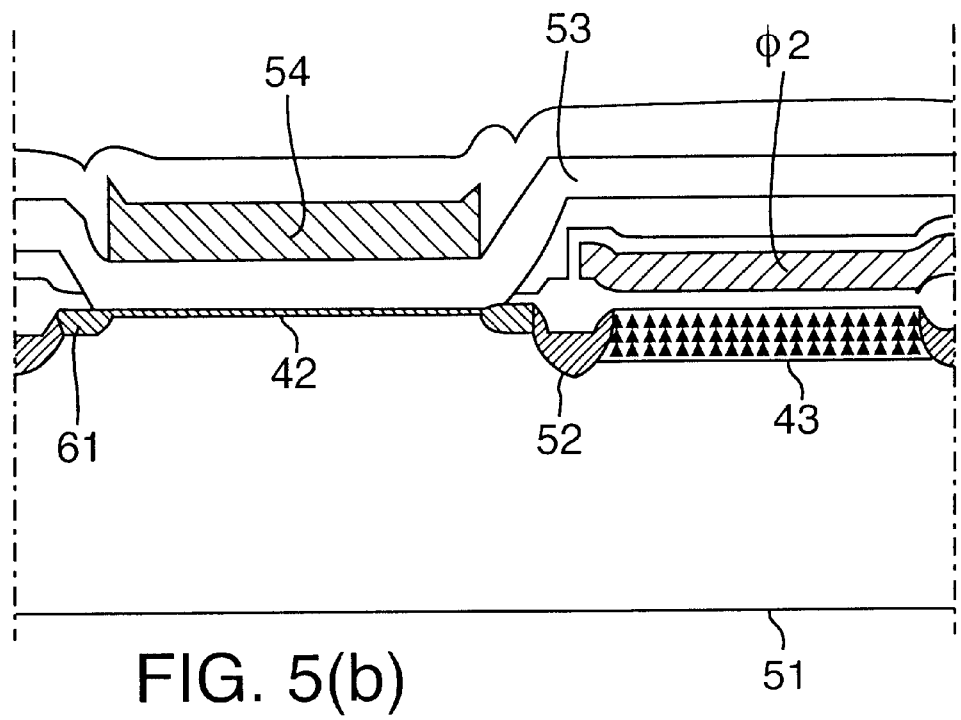
FIG. 5(b) is a sectional view of a photosensor of the imaging device of FIG. 4.

With reference to FIG. 5(b), the diodes 42 are formed by depositing Pt layers on a surface of a p-type substrate 51 and heating. Guard rings 61 and the isolation regions 52 are formed around the diodes 42; the guard rings 61 and the isolation regions 52 reduce leakage currents.

Each vertical CCD array 43 comprises an n-type diffusion layer adjacent the isolation region 52. The electrodes φ1–φ4 are arranged on the vertical CCD array 43 and are separated by insulating layers. The diodes 42 have corresponding aluminum reflecting layers 54 for reflecting an incident infrared flux 60; the layers 54 are separated from the diodes 42 by insulating films 53 of silicon dioxide.

Figure 6:
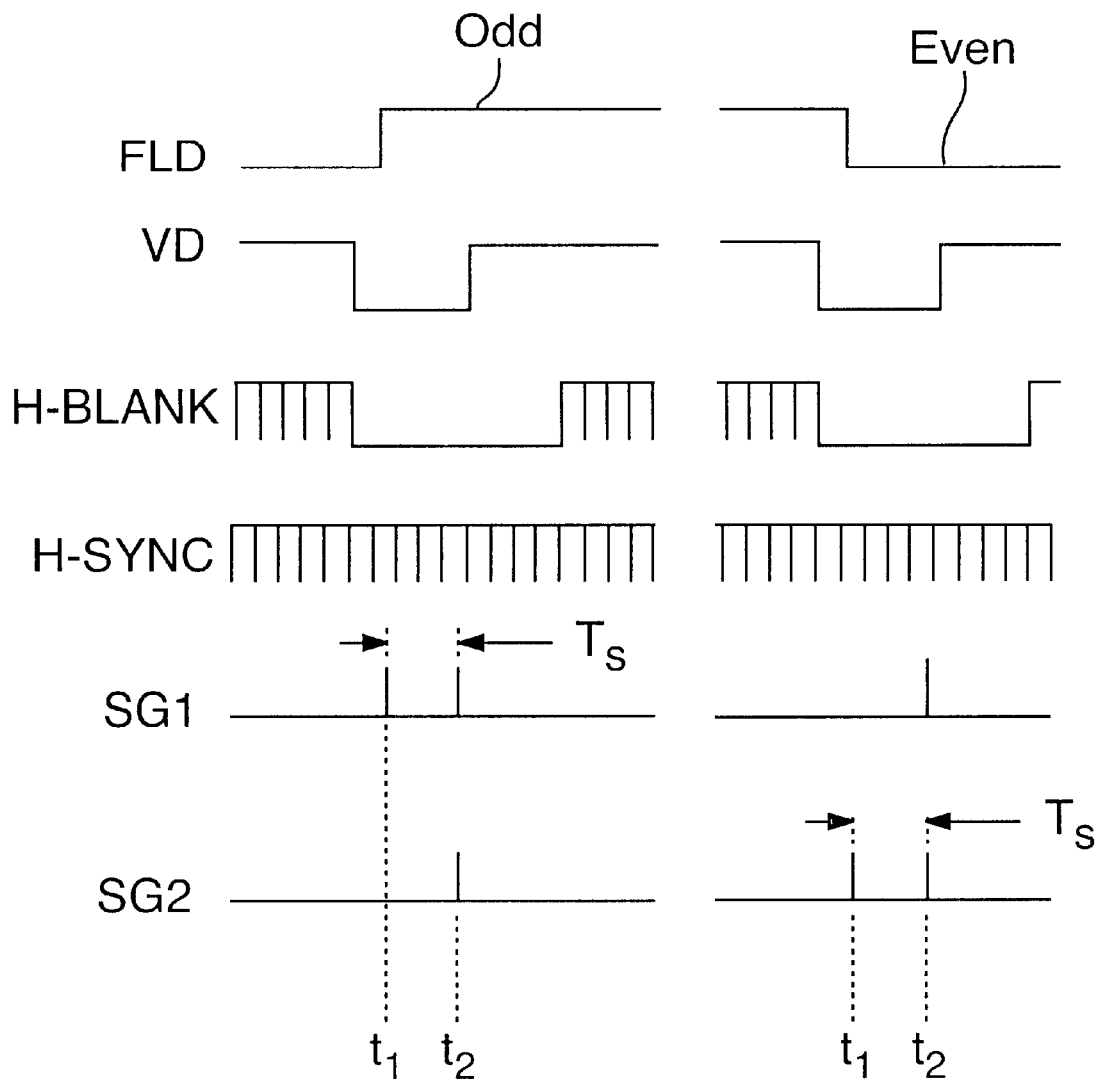
FIG. 6 is a timing diagram illustrating the timing of charge transfers for the imaging device of FIG. 4.

The operation of the imaging device of Example Embodiment 1 is described with reference to FIGS. 6–7. The operation is described with application to the NTSC video format, although it will be apparent that other video formats are equally suitable. In the NTSC format, individual images consist of two fields, an even field and an odd field. An even or an odd field generally comprises one-half of the picture elements required to generate one complete image. The fields alternately comprise signal readouts from odd and even rows. The fields are read out and displayed about every 1/60 s; a complete image is displayed about every 1/30 s. Such a system is referred to as an "interlaced-scan" system, and the complete image is an interlaced image. In some NTSC systems, signal charges corresponding to different rows are summed; a row is alternately summed with the following and the preceding row.

The readout of an even field is described with reference to FIG. 6 and FIGS. 7(a)–7(c). A field-selection voltage FLD is applied to select readout of an even field. A horizontal blanking voltage H-BLANK, a horizontal synchronization voltage H-SYNC, and a vertical synchronization VD are provided. At a time $t_1$ during a vertical blanking interval, the vertical drive circuit 45 applies a voltage SG2 to the electrodes φ1. Unwanted charges $Q_{47a}$, $Q_{47b}$, $Q_{47c}$ accumulated by the diodes 42 of exemplary odd rows 47a, 47b, 47c, respectively, are then transferred to the regions of the vertical CCD arrays 43 beneath the electrodes φ1. Charges of other odd rows 47 are similarly transferred, but, for simplicity, only a single column of the rows 47a, 47b, 47c is shown. The vertical drive circuit 45 then drives the electrodes φ1–φ4 so that the charges $Q47_a$, $Q47_b$, $Q47_c$ on the vertical CCD arrays 43 are rapidly transferred in a direction 55 to the discharge line 46 where they are discharged. It will be apparent that the charges discharged at the discharge line 46 can correspond to dark current and photoconverted charge generated at the diodes 42 before the time $t_1$.

With reference to FIG. 7(b), at a time $t_2$, an accumulation time $T_s$ after $t_1$, the vertical drive circuit 45 applies voltages SG2, SG1 to the electrodes φ1, φ3, respectively. The voltages SG2, SG1 transfer signal charges $S_{47}$, $S_{48}$ from the diodes 42 in both odd rows 47 and even rows 48, respectively, to the vertical CCD array 43 at the electrodes φ1, φ3. In this manner, signal charges $S_{47}$ accumulated by the odd rows 47 for an accumulation time $T_s$ and signal charges $S_{48}$ accumulated by the even rows 48 for a field period are transferred to the vertical CCD arrays 43. Because the charges $S_{47}$ from the odd rows 47 are discharged at the time $t_1$, signal charges accumulate for a shorter time on the odd rows 47 than on the even rows 48.

With further reference to FIGS. 7(a)–7(c), after the accumulated charges are transferred to the vertical CCD array 43 at time $t_2$ the vertical drive circuit 45 applies an intermediate voltage to the electrodes φ1, φ3, φ4, so that a series of potential wells form under the electrodes φ1, φ3, φ4. The signal charges from the odd rows 47a–47c (i.e. the charges $S_{47a}$, $S_{47b}$, $S_{47c}$) are summed with signal charges from the even rows 48 in the potential wells. For example, charges from diodes 42 in the same column but in rows 47a, 48a are summed. Similarly, charges from diodes 42 in other columns and in rows 47b, 48b are summed. When the vertical blanking interval ends, the vertical drive circuit 45 drives the electrodes φ1–φ4. The summed charges on the vertical CCD arrays 43 are thentransferred to the horizontal CCD array 44 during a horizontal blanking interval and then delivered to the output amplifier 49.

An odd field is read out similarly. A field selection voltage FLD is applied to select readout of an odd field. At a time $t_1$ in a vertical blanking interval, the vertical drive circuit 45 applies a voltage SG1 to the electrodes φ3. Unwanted charges accumulated on the even rows 48a, 48b of diodes 42 are transferred to the regions on the vertical CCD arrays 43 under the electrodes φ3. The vertical drive circuit 45 then drives the electrodes φ1–φ4 so that the unwanted charges are delivered to and discharged by the discharge line 46.

At a time $t_2=t_1+T_s$, the vertical drive circuit 45 applies voltages SG2, SG1 to the electrodes φ1, φ3, respectively. Signal charges accumulated on both the even rows 48 and the odd rows 47 of diodes 42 are then transferred to the vertical CCD arrays 43. Signal charges accumulated during the accumulation time $T_s$ are delivered from the diodes 42 in the even rows 48a–48c; signal charges from the odd rows 47a–47c are accumulated for a longer time corresponding to the field period.

The vertical drive circuit 45 then applies voltages to the electrodes φ1–φ3, forming a series of potential wells under the electrodes φ1–φ3. The signal charges from corresponding diodes 42 in the odd rows 47 and the even rows 48 are summed in these potential wells. At the end of the vertical blanking interval, the vertical drive circuit 45 drives the electrodes φ1–φ4 so that signal charges on the vertical CCD arrays 43 are transferred to the horizontal CCD array 44 during a horizontal blanking interval and then to the output amplifier 49. In this way, charges accumulated for different times on the rows 47, 48 are summed in the vertical CCD arrays 43.

Figure 8:
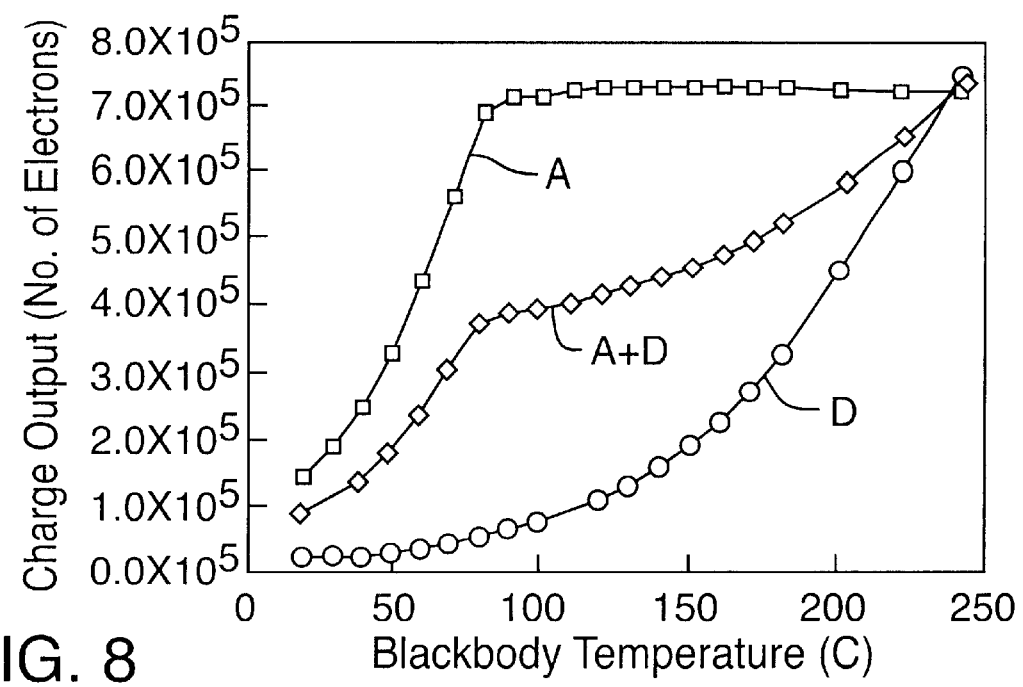
FIG. 8 is a graph of charge output as a function of object blackbody temperature for the imaging device of Example Embodiment 1.
Figure 9:
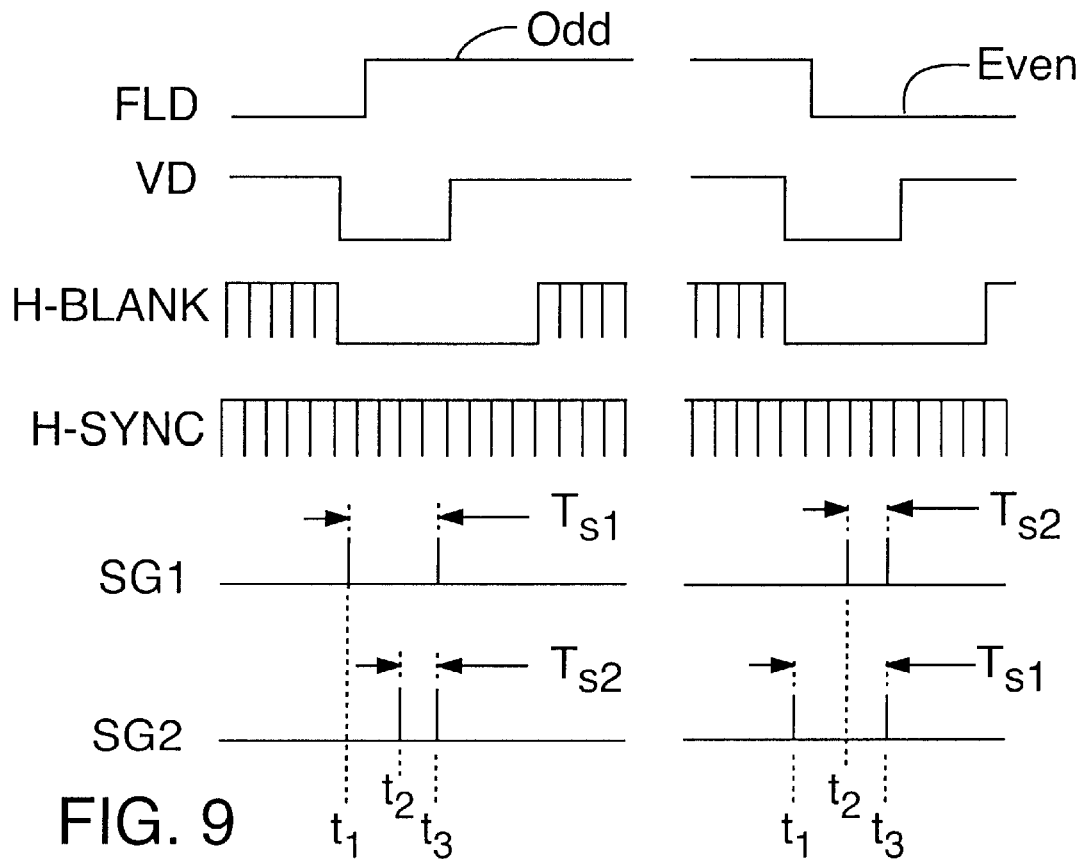
FIG. 9 is a timing diagram illustrating the timing of charge transfers according to Example Embodiment 2.

The effective output of the imaging device of Example Embodiment 1 as described above is shown in FIG. 8. The output as a function of blackbody temperature for accumulation times of 1/60 s and 1/1500 s are shown as curves A and D, respectively; the curve A+D shows the output obtained when the accumulation times alternate. As shown in FIG. 8, an image signal with multiple gray-scale levels and wide dynamic range is provided for imaging objects with blackbody temperatures between 80 C. and 250 C.

Figure 3A:
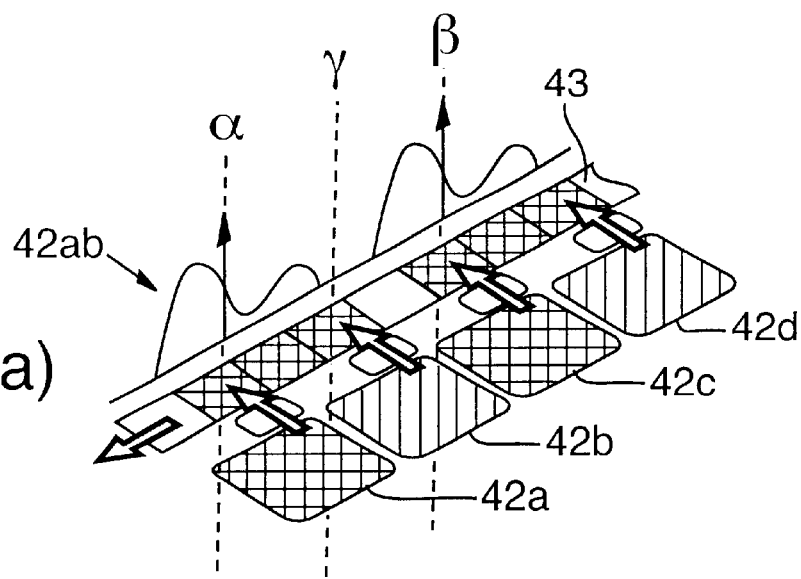
FIGS. 3(a)–3(c) illustrate charge distributions obtained by summing charge distributions with different charge accumulation times.
Figure 3B:
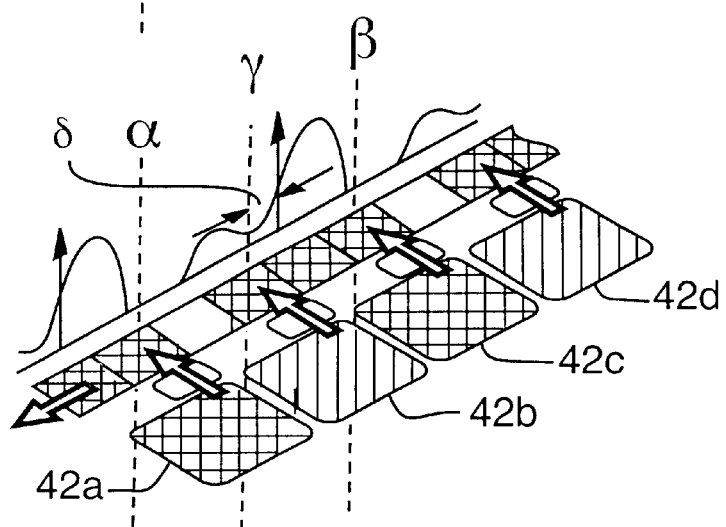
Figure 3C:
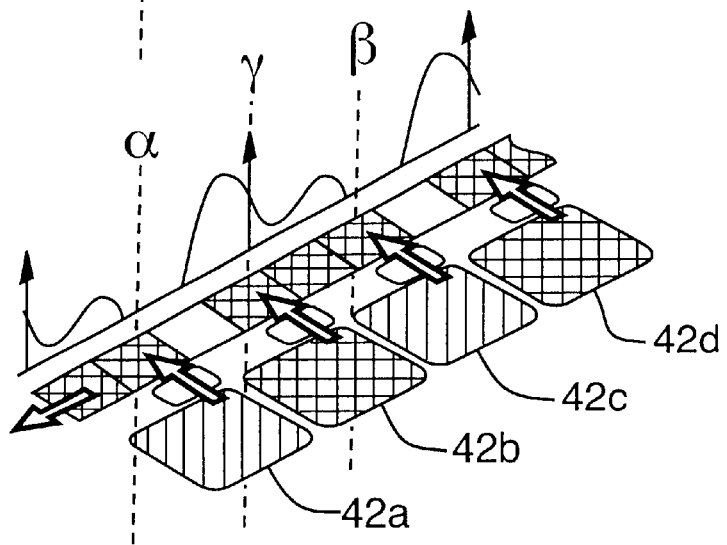

Because the long and short accumulation times (i.e., the field period and the accumulation time $T_s$) alternate between the odd rows 47 and the even rows 48, a shift in the apparent position of the image is avoided. With reference to FIG. 3(a), exemplary charge distributions such as charge distribution 42ab for a representative column of diodes 42 (exemplary diodes 42a–42d) for an odd field, have apparent centers α, β, γ. These centers are shifted toward the diodes 42a, 42d that have the longer accumulation time. With reference to FIG. 3(b), a similar displacement δ of the apparent center of the summed charge distributions of the exemplary diodes 42b, 42c is shown. The displacement δ results from the diodes 42b, 42c accumulating charge for time periods of different lengths. With reference to FIG. 3(c), the accumulation periods of diodes 42b, 42c of FIG. 3(b) are switched so that there is no displacement of the center of the charge distribution. With such alternation of the accumulation periods, image resolution is not degraded by a displacement in the center of the charge distribution.

EXAMPLE EMBODIMENT 2

The structure of an imaging device according to Example Embodiment 2 is identical to that of Example Embodiment 1 as shown in FIGS. 4 and 5(a)–5(b), and the description thereof is omitted.

Readout of an even field is described with reference to FIGS. 9 and 10(a)–10(d). First, at a time $t_1$ within a vertical blanking interval (FIG. 10(a)), the vertical drive circuit 45 applies a voltage to the electrodes φ1. Unwanted charges accumulated on the odd rows 47a–47c are transferred to the vertical CCD array 43. At a time $t_2$ within the vertical blanking interval (FIG. 10(b)), the vertical drive circuit 45 applies a voltage to the electrodes φ3. Unwanted charges accumulated on the even rows 48a, 48b are transferred to the vertical CCD array 43. Next, the vertical drive circuit 45 drives the electrodes φ1–φ4 so that the unwanted charges transferred to the vertical CCD array 43 are transferred to and discharged by the discharge line 46.

At a time $t_3$ during the vertical blanking interval (FIG. 10(c)), the vertical drive circuit 45 applies a high voltage to the electrodes φ1, φ3. Signal charges accumulated on both even rows 48 and odd rows 47 of diodes 42 are transferred to the regions of the vertical CCD array 43 defined by the electrodes φ3, φ1, respectively. Signal charges C, E, G on the odd rows 47 are accumulated for an accumulation time of $t_3-t_1$ while signal charges D, F on the even rows 48 are accumulated for an accumulation time of $t_3-t_2$.

After the signal charges are transferred to the vertical CCD array 43, the vertical drive circuit 45 applies a voltage to the electrodes φ1, φ3, φ4 to form a series of potential wells under the electrodes φ1, φ3, φ4 (FIG. 10(d)). The signal charges are summed in these potential wells. For example, the charges C, D are summed in one potential well, and the charges E, F are summed in another. The vertical drive circuit 45 drives the electrodes φ1–φ4 so that the summed charges transfer in a direction 57 along the vertical CCD array 43 to the horizontal array CCD 44 during a horizontal blanking interval. The charges are then transferred to the output amplifier for readout.

An odd field is read out similarly. First, at a time $t_1$ within a vertical blanking interval, the vertical drive circuit 45 applies a voltage to the electrodes φ3. Unwanted charges accumulated on the even rows 48 are transferred to the vertical CCD array 43. At a time $t_2$ within the vertical blanking interval, the vertical drive circuit 45 applies a voltage to the electrodes φ1. Unwanted charges accumulated on the odd rows 47 are transferred to the vertical CCD array 43. The vertical drive circuit 45 then drives the electrodes φ1–φ4 so that these charges are transferred to and discharged by the discharge line 46.

At a time $t_3$ in a vertical blanking interval, tire vertical drive circuit 45 applies a voltage to the electrodes φ1–φ3. Signal charges accumulated on even rows 48 and odd rows 47 are transferred simultaneously to the vertical CCD array 43. Signal charges accumulated during an accumulation period of $t_3$–$t_1$ are transferred from the even rows 48; signal charges accumulated for an accumulation period of $t_3$–$t_2$ are transferred from the odd rows 47a–47c. The vertical drive circuit 45 then applies an intermediate voltage to the electrodes φ1–φ3. A series of potential wells is then formed under the electrodes φ1–φ3. The signal charges are summed in the potential wells.

When the vertical blanking interval ends, the vertical drive circuit 45 drives the electrodes φ1–φ4 so that the signal charges on the vertical CCD array 43 are transferred to the horizontal CCD array 44 during a horizontal blanking interval. The horizontal CCD array 44 then delivers the charges to the output amplifier.

While the imaging device of Example Embodiment 2 has the same advantages as that of Example Embodiment 1, Example Embodiment 2 has an additional advantage. In Example Embodiment 2, both the even and odd rows are electronically shuttered so that objects having higher blackbody temperatures can be well-imaged.

EXAMPLE EMBODIMENT 3

Figure 11:
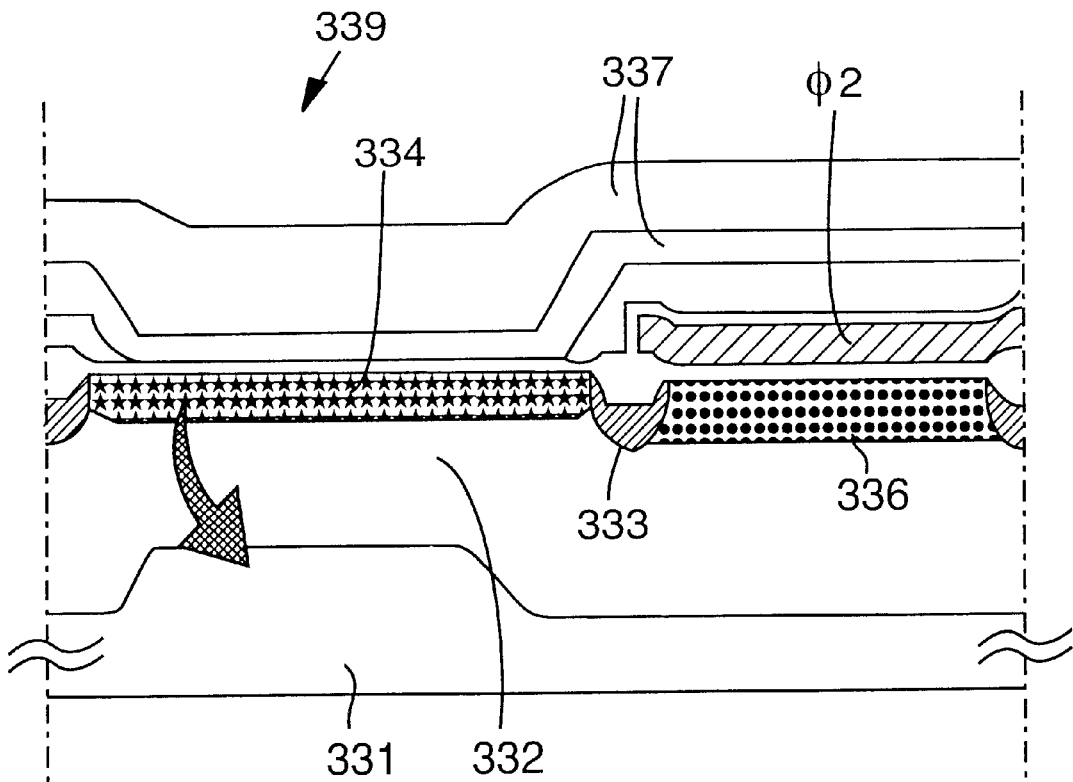
FIG. 11 is a sectional view of a photosensor according to Example Embodiment 3.

With reference to FIG. 11, an imaging device according to Example Embodiment 3 that receives an incident light flux 339 comprises an array of n-type photosensors 334 on an n-type silicon substrate 331; a shallow well junction 332 separates the photosensors 334 from the substrate 331. For convenience, only a single photosensor 334 of the array is shown in FIG. 11. Alternatively, if a buried photosensor is preferred to reduce dark current, a p-type diffusion layer can be formed on surfaces of the sensors 334 facing the light flux 339. A vertical CCD 336 formed by an n-type diffusion layer is adjacent the sensors 334, separated by an isolation region 333. Electrodes φ1–φ4 are formed on respective vertical CCDs 336 with an insulating film between them. Insulating layers 337 of $SiO_x$ cover the photosensors 334 and the electrodes φ1–φ4.

The portion of the shallow well junction 332 beneath the sensor 334 is shallower than the other portions of the shallow well junction 332. This creates a so-called "vertical overflow drain structure." This structure provides a discharge path for excess charge accumulated by the photosensor 334. However, other structures, such as a so-called "lateral overflow drain structure," are equally applicable.

A reverse bias is applied to the junction between the n-type substrate 331 and the shallow well junction 332, depleting the portion of the shallow well junction 332 beneath the photosensor 334. As signal charges accumulate on the photosensor 334, the potential of the photosensor 334 decreases. If sufficient charge accumulates, the junction between the photosensor 334 and the shallow well junction 332 becomes forward-biased. Thereafter, charges overflowing the photosensors 334 are removed longitudinally through the shallow well junction 332 and into the substrate 331 because of the reverse bias.

When the imaging device of Example Embodiment 3 is operated as described above with respect to Example Embodiment 1, accumulation of charge by the photosensor 334 for long accumulation times (such as the 1/60 s NTSC field time) is satisfactory. The vertical overflow drain acts as a sink for charges overflowing from the photosensor, so the vertical overflow drain structure prevents the overflow charges from entering the vertical CCDs 36.

EXAMPLE EMBODIMENT 4

Figure 12:
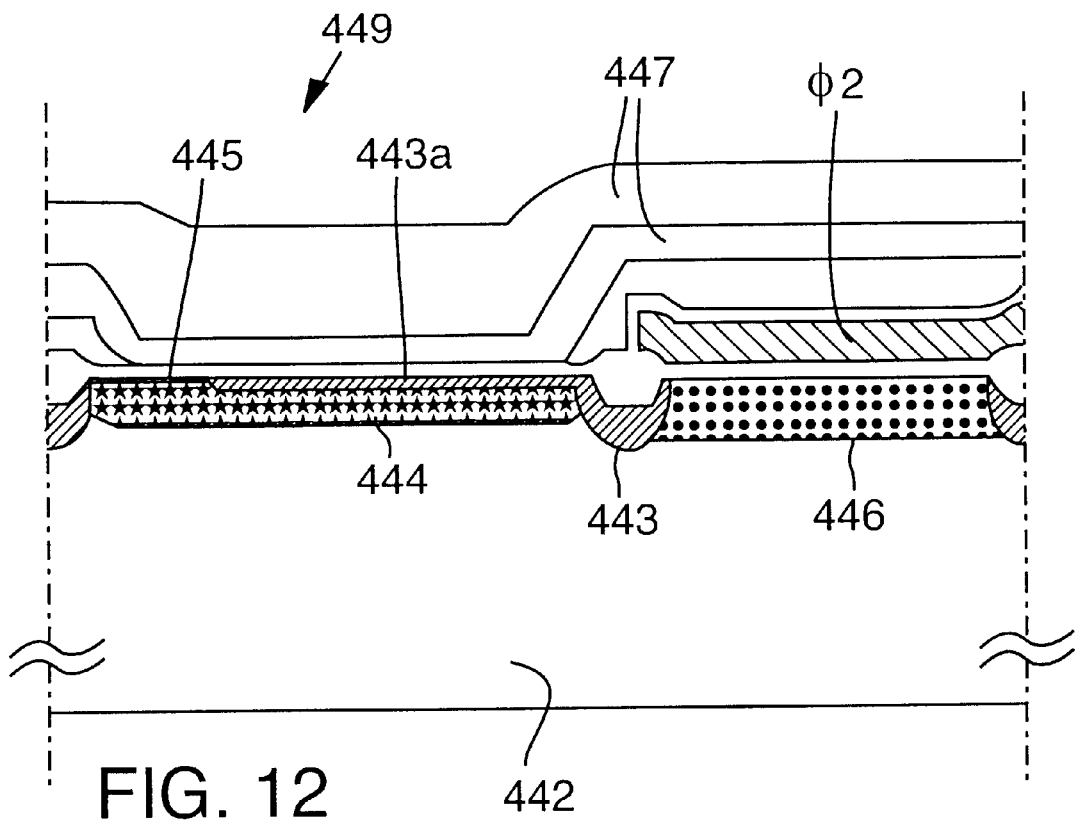
FIG. 12 is a sectional view of a photosensor according to Example Embodiment 4.

With reference to FIG. 12, an imaging device according to Example Embodiment 4 comprises an array of n-type absorption regions 444 on a p-type silicon substrate 442. For convenience, only a single absorption region 444 of the array is shown in FIG. 12. The absorption region 444 receives a visible light flux 449. Dark current is reduced with an embedded-photodiode structure by forming a shallow p-type diffusion layer 443a on the absorption region 444. A PtSi Schottky diode 445 is formed between the layer 443a and the absorption region 444 by reacting platinum (Pt) with silicon (Si). The p-type diffusion layer 443a provides a discharge path for charge accumulated in the absorption region 444.

A vertical CCD 446 comprises an n-type diffusion layer adjacent to the absorption region 444. An isolation region 443 separates the vertical CCD 446 and the absorption region 444. Electrodes φ1–φ4 are formed on the respective vertical CCDs 46, separated by insulating layers. Only the electrode φ2 is shown in FIG. 12.

Because the potential barriers of the PtSi Schottky junctions are lower than the potential barrier of a p-n junction, as signal charge accumulates in the absorption region 444, the charge soon overflows the PtSi Schottky diode 445. The overflow charge is released to the p-type substrate 442 via the p-type diffusion layer 443a and the p-type isolation region 443. If readout is performed as described above with respect to Example Embodiment 1, the overflow charge is discharged into the substrate 442 and does not reach the vertical CCD 446.

EXAMPLE EMBODIMENT 5

Figure 13:
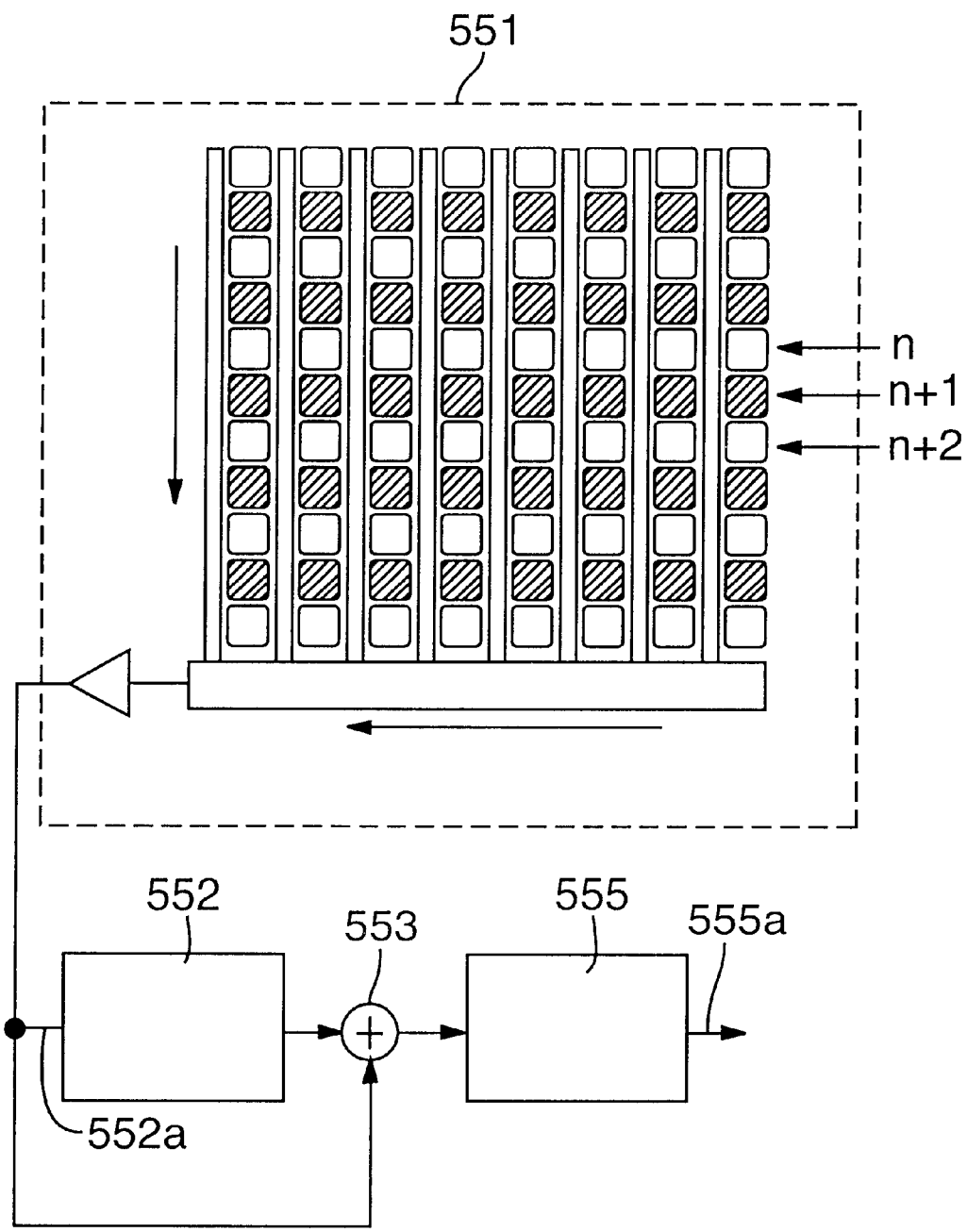
FIG. 13 is a schematic of an imaging device according to Example Embodiment 5.

With reference to FIG. 13, an image output of a solid-state imaging device 551 is input to a delay line 552 through an input terminal 552a and directly to an adder 553. A delayed output of the delay line 552 is also supplied to the adder 553. The adder 553 sums the direct and delayed outputs and delivers the sum to a lookup device 555 that supplies an output to an output terminal 555a. The lookup device 555 uses a lookup table to determine the output based on the sum delivered from the adder 553.

An image is read out from the imaging device 551 as follows. First, the imaging device 551 accumulates signal charges for accumulation times that differ for even- and odd-numbered rows. I.e., the nth and (n+2)th rows have a different accumulation time than the (n+1)th row.

The imaging device 551 is preferably driven at a multiplied speed in vertical and horizontal directions, whereby an image signal is read at the multiplied speed. The imaging device 551 is preferably read out at a doubled speed. If the time H is the time required to read out a single row with the normal (conventional) readout rate, then the delay line 552 delays the image signal by H/2 and thus outputs a signal representing an immediately preceding horizontal line. The adder 553 sums a horizontal line and an immediately preceding horizontal line. The lookup device 555 uses the lookup table 55 to provide predetermined gain control on the sum. If the readout is at a doubled speed, then the image signal provided by the summing junction (i.e., the sum of two rows) is at the same rate as without the summation.

Example Embodiment 5 has advantages similar to those of Example Embodiment 1. Example Embodiment 5 has the particular advantage that the imaging device 555 can be an existing device and requires no modification because the summing junction 552 is external to the imaging device 551.

EXAMPLE EMBODIMENT 6

Figure 14:
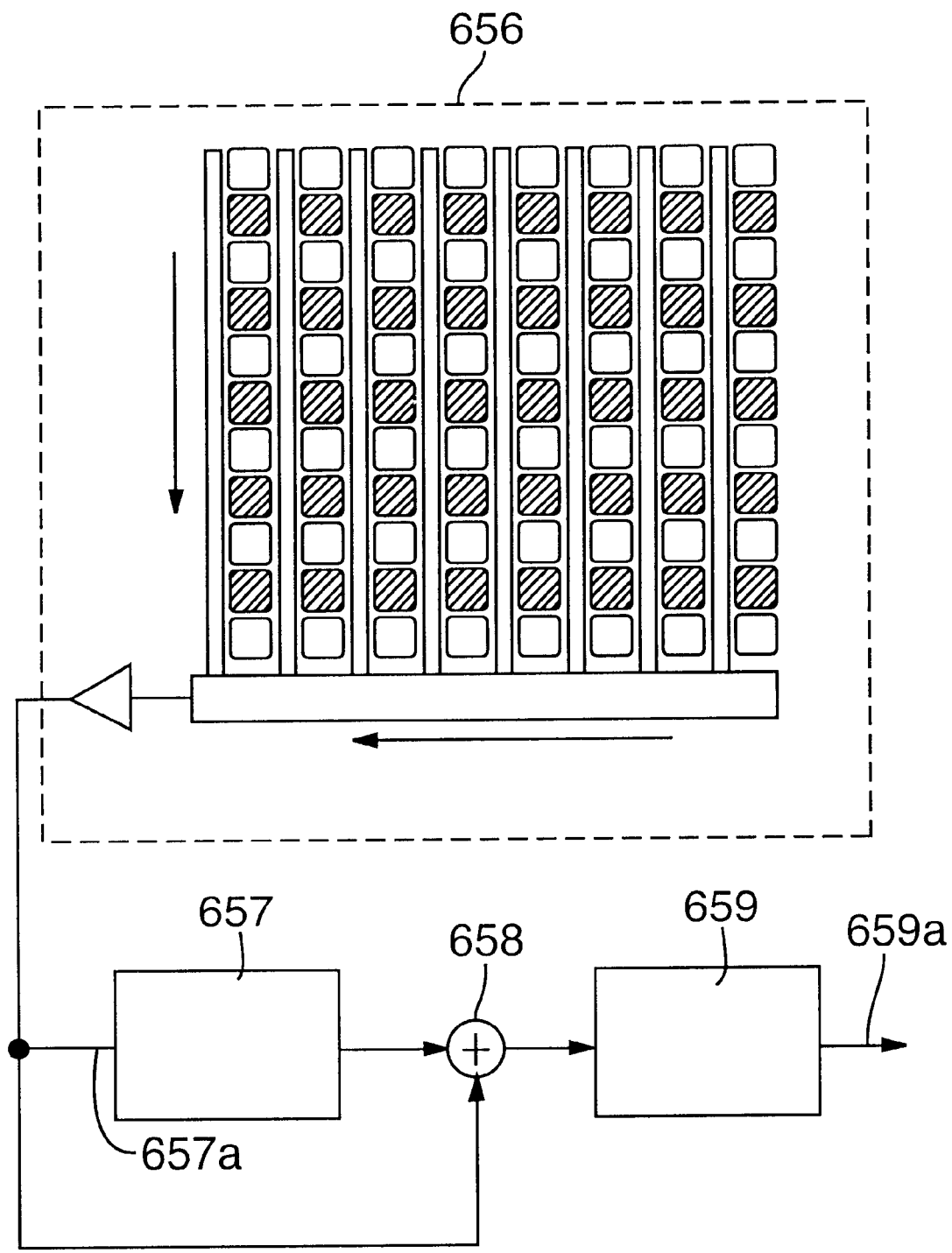
FIG. 14 is a schematic of an imaging device according to Example Embodiment 6.
Figure 15:
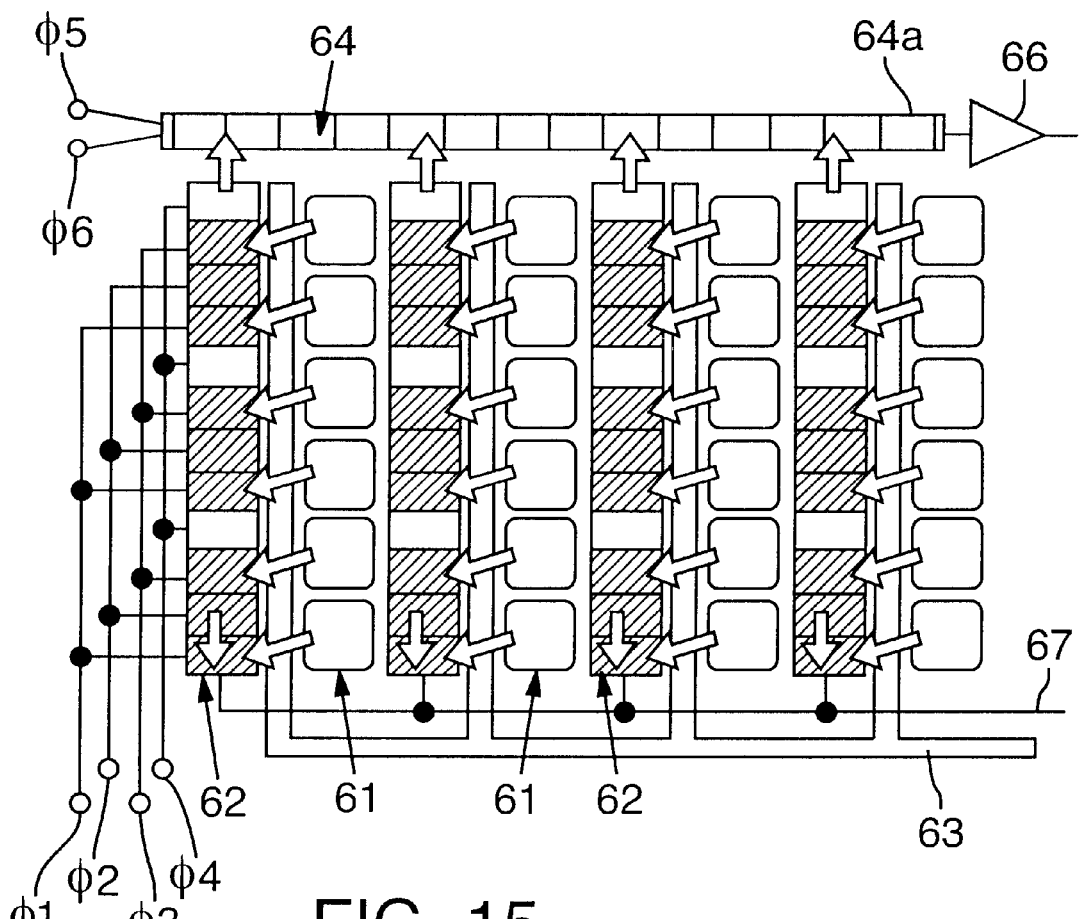
FIG. 15 is a schematic of a prior-art solid-state imaging device.
Figure 16:
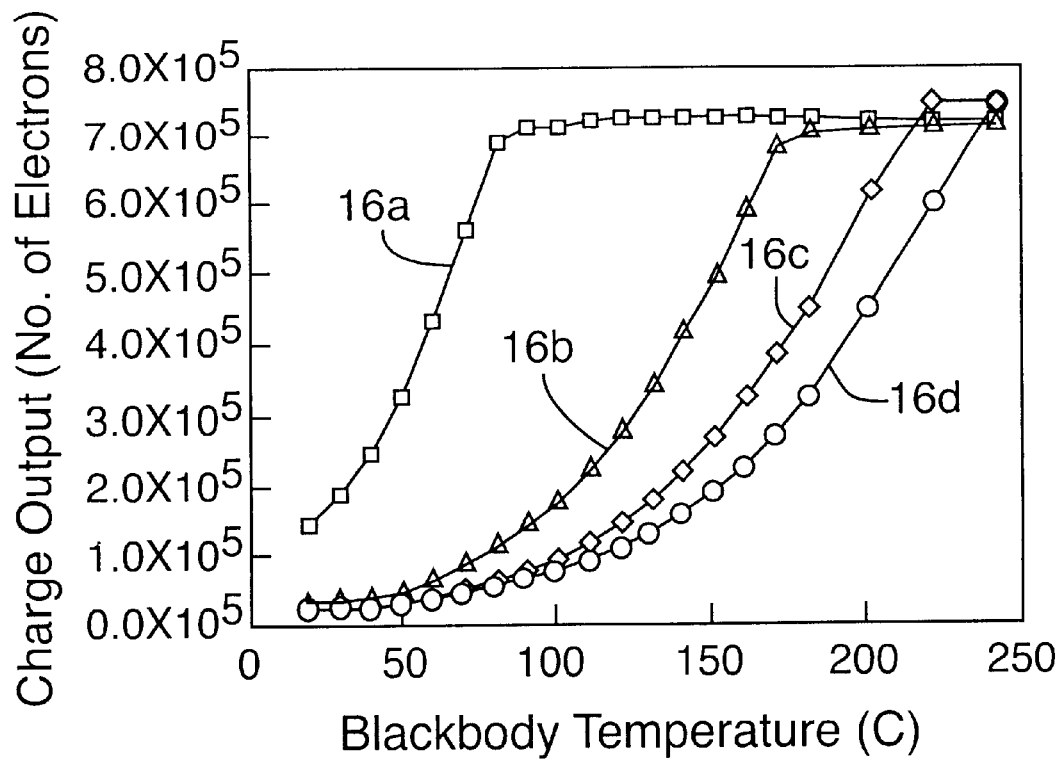
FIG. 16 is a graph of charge output as a function of object blackbody temperature for a prior-art imaging device at various electronic shutter speeds.

With reference to FIG. 14, an image output of a solid-state imaging device 656 is supplied to a single-field delay line 657 at an input 657a and directly to an adder 658. The delay line 657 supplies a delayed output to the adder 658. The adder 658 sums the direct and delayed image outputs and delivers the sum to a lookup device 659 that provides an output 659a based on the sum. The lookup device 659 uses a lookup table to determine the output.

The operation of Example Embodiment 6 is as follows. First, the image sensor 556 accumulates signal charges for accumulation times that are different for successive fields. In particular, odd fields have one accumulation time and even fields have a different accumulation time. The single-field delay line 557 delays a readout-image signal representing a field by one field time, and outputs an image signal representing an immediately preceding field.

The summing junction 558 adds the delayed field and a current field so that delayed and direct signals from each pixel are summed. The lookup device 559 delivers the sum with a gain control determined by the lookup table. A resultant output is then output externally.

Example Embodiment 6 has advantages similar to those of Example Embodiment 1. A particular advantage of Example Embodiment 6 is that an existing imaging device can serve as the imaging device 656 because the summing junction 657 is external to the imaging device 656. In contrast, in the imaging device of Example Embodiment 1, charges are summed in the vertical CCD arrays 43.

While the Example Embodiments are discussed with application to NTSC video standard, the invention is not limited a particular video format. It will be apparent that the invention is applicable to various field rates and sizes of the array of photosensors. In addition, it will be apparent that the imaging devices of the Example Embodiments are applicable to still images as well as video images. In the Example Embodiments, unwanted charges are completely discharged. It will be apparent that, even if only a portion of the unwanted charges is discharged, the dynamic range is still expanded.

In the Example Embodiments 1–4, electronic shutter operation is possible for accumulation times of less than or equal to the vertical blanking period. However, the invention is not limited to such operation. For example, if a dedicated discharge path is provided, the accumulation period can be longer than the vertical blanking period.

Schottky barriers of platinum silicide (PtSi) and silicon are used as the photosensors in some Example Embodiments. PtSi Schottky barriers are advantageous in that they are suitable for infrared imaging. Other barrier materials can be used as well, such as iridium silicide (IrSi), palladium silicide (PdSi), or other metallic silicides. The photosensors can also be p-n junctions. If silicon p-n junctions are used, then the imaging device is sensitive to visible light.

Schottky barriers between platinum silicide (PtSi) and silicon are used in some Example Embodiments to discharge excess charge so that such charge does not reach the vertical CCD arrays or other photosensors, but the invention is not limited to this structure. Any potential barrier will generally be sufficient if the barrier is lower than the potential barrier in a p-n junction of the substrate material. For example, Schottky barriers between metallic suicides such as iridium silicide (IrSi) or palladium silicide (PdSi) and silicon are suitable.

In the Example Embodiments, bright areas of objects are imaged with multiple gray-scale levels using rows of photosensors that accumulate signal charge for relatively short accumulation times. In contrast, dark areas are imaged with a high signal-to-noise ratio and multiple gray-scale levels using rows of photosensors that have longer charge-accumulation times. Therefore, for both bright and dark areas, improved images are obtained. In particular, the longer accumulation time is preferably set so that the photosensors receiving the greatest incident light flux are saturated. In addition, by selecting and displaying charges from rows with longer or shorter accumulation times, improved images of either bright or dark areas are produced. Furthermore, the summation of signal charges from alternating long and short accumulation times is readily carried out using vertical transfer paths, such as the vertical CCD arrays 43, provided within the imaging device.

By alternately associating the long and short accumulation times with even and odd rows of photosensors, apparent shifts in image position are avoided.

The long accumulation time is preferably set so that some of the photosensors of the imaging device saturate. Excess charge accumulated by such photosensors can be discharged into a substrate through, for example, a shallow potential well. Such discharge prevents blooming.

In addition, an external circuit can be provided to combine signal charges from rows with long and short accumulation times. Therefore, existing imaging devices can be adapted to have the advantages described herein.

Having illustrated and demonstrated the principles of the invention in multiple example embodiments, it should be apparent to those skilled in the art that the example embodiments can be modified in arrangement and detail without departing from such principles. We claim as th Invention all that comes within the scope of the following claims.

What is claimed is:

1. A solid-state imaging device, comprising:
  (a) a two-dimensional array of photosensors comprising vertical columns and odd-numbered and even-numbered horizontal rows of photosensors, the photosensors accumulating signal charges corresponding to an incident light flux;
  (b) vertical transfer paths associated with the columns of photosensors;
  (c) gates for delivering charges accumulated on the photosensors during an accumulation time to the vertical transfer paths;
  (d) a horizontal transfer path for transferring the signal charges received from the vertical transfer paths to an output;
  (e) a vertical drive circuit that controls the gates so that signal charges accumulate for a first accumulation time in the photosensors in the odd rows and a second accumulation time in the photosensors in the even rows, wherein the first and second accumulation times are unequal, the vertical drive circuit also directing the signal charges from the vertical transfer paths to the horizontal transfer path, so as to produce an image signal; and
  (f) a summing junction for summing signal charges from photosensors from the same column and adjacent rows of the array of photosensors, the image signal corresponding to the summed signal charges.

2. The imaging device of claim 1, wherein the longer of the first and second accumulation times is selected so at least one photosensor is saturated by the incident light flux.

3. The imaging device of claim 1, wherein the gates alternately switch the first and second accumulation times between the odd-numbered and the even-numbered rows of photosensors.

4. The imaging device of claim 1, wherein the vertical transfer paths comprise the summing junction.

5. The imaging device of claim 1, wherein the gates alternately switch the first and second accumulation times between the odd-numbered and even-numbered rows of photosensors, whereby an image signal is produced alternately corresponding to the first accumulation time and the second accumulation time.

6. The imaging device of claim 1, wherein the photosensors are Schottky barriers.

7. The imaging device of claim 1, wherein the photosensors are silicon p-n junctions.

8. The imaging device of claim 7, further comprising a charge releaser for releasing excess charges from the photosensors.

9. The imaging device of claim 8, wherein the charge releaser provides a potential barrier lower than the potential barrier of the p-n junction.

10. A solid-state imaging device, comprising:
   (a) a two-dimensional array of photosensors comprising vertical columns and odd-numbered and even-numbered horizontal rows of photosensors, the photosensors accumulating signal charges corresponding to an incident light flux;
   (b) vertical transfer paths associated with the columns of photosensors;
   (c) gates for delivering charges accumulated on the photosensors during an accumulation time to the vertical transfer paths;
   (d) a horizontal transfer path for transferring the signal charges received from the vertical transfer paths to an output;
   (e) a vertical drive circuit that controls the gates so that signal charges accumulate for a first accumulation time in the photosensors in the odd rows and a second accumulation time in the photosensors in the even rows, wherein the first and second accumulation times are unequal, the vertical drive circuit also directing the signal charges from the vertical transfer paths to the horizontal transfer path, so as to produce an image signal;
   (f) a summing junction for summing signal charges; and
   (g) a delay line that (1) receives an output from the horizontal transfer path, (2) delays the output by a delay time, and (3) delivers the output to the summing junction, wherein the delay time is equal to a time required to transfer signal charges from an entire row to the horizontal transfer path, wherein an image signal is produced corresponding to the sum of the signal charges in alternate rows.

11. A method for producing an image signal from an imaging device comprising an array of photosensors arranged in vertical columns and odd-numbered and even-numbered horizontal rows, the photosensors accumulating signal charges corresponding to an incident light flux, the method comprising the steps of:
   (a) accumulating signal charges on the odd-numbered rows for a first accumulation time;
   (b) accumulating signal charges on the even-numbered rows for a second accumulation time different from the first accumulation time;
   (c) producing an image signal having horizontal lines corresponding to the signal charges accumulated by the odd-numbered and even-numbered rows;
   (d) receiving signal charges from the columns of photosensors in vertical transfer paths corresponding to the columns of photosensors; and
   (e) in a vertical drive circuit in communication with the vertical transfer paths, summing signal charges from photosensors in the same column and adjacent rows, wherein the image signal corresponds to the summed signal charges.

12. The method of claim 11, further comprising the step of alternately associating the first accumulation time and the second accumulation time with the odd-numbered and even-numbered rows, the odd-numbered and even-numbered rows alternately accumulating signal charges for the first and second accumulation times.

13. The method of claim 12, further comprising the step of selecting the longer of the first and second accumulation times so that at least one photosensor is saturated.

14. A method for producing an image signal from an imaging device comprising an array of photosensors arranged in vertical columns and odd-numbered and even-numbered horizontal rows, the photosensors accumulating signal charges corresponding to an incident light flux, the method comprising the steps of:
   accumulating signal charges on the odd-numbered rows for a first accumulation time;
   accumulating signal charges on the even-numbered rows for a second accumulation time different from the first accumulation time;
   producing an image signal having horizontal lines corresponding to the signal charges accumulated by the odd-numbered and even-numbered rows;
   providing a delay line that delays the output corresponding to a single row of photosensors by a time equal to the time required to read out a single row of photosensors; and
   providing a summing junction that sums signal charges from a row of sensors with signal charges from a preceding row of sensors that is delayed by the delay line, the image signal corresponding to the summed signal charges.

* * * * *

UNITED STATES PATENT AND TRADEMARK OFFICE
CERTIFICATE OF CORRECTION

PATENT NO.   : 6,429,898 B1
DATED        : August 6, 2002
INVENTOR(S)  : Shoda et al.

It is certified that error appears in the above-identified patent and that said Letters Patent is hereby corrected as shown below:

Column 3,
Line 46, "delay" should be -- delay line. --.

Column 4,
Line 14, "times." should be -- times --.
Line 47, "view of a the" should be -- view of the --.

Column 6,
Line 5, "to 35 the" should be -- to the --.
Line 14, "(φ1" should be -- φ1 --.

Column 7,
Line 24, "thentransferred" should be -- then transferred --.

Column 11,
Line 65, "suicides" should be -- silicides --.

Column 12,
Line 36, "th Invention" should be -- the invention --.

Signed and Sealed this

Twenty-fifth Day of March, 2003

JAMES E. ROGAN
*Director of the United States Patent and Trademark Office*